United States Patent
Nara et al.

(10) Patent No.: US 10,914,846 B2
(45) Date of Patent: Feb. 9, 2021

(54) IMAGE SENSOR

(71) Applicant: Tianma Japan, Ltd., Kanagawa (JP)

(72) Inventors: Shuhei Nara, Kanagawa (JP);
Hiroyuki Sekine, Kanagawa (JP);
Takayuki Ishino, Kanagawa (JP);
Fuminori Tamura, Kanagawa (JP);
Yoshikazu Hatazawa, Kanagawa (JP)

(73) Assignee: TIANMA JAPAN, LTD., Kanagawa (JP)

( * ) Notice: Subject to any disclaimer, the term of this patent is extended or adjusted under 35 U.S.C. 154(b) by 106 days.

(21) Appl. No.: 16/459,792

(22) Filed: Jul. 2, 2019

(65) Prior Publication Data
US 2020/0003911 A1 Jan. 2, 2020

(30) Foreign Application Priority Data

Jul. 2, 2018 (JP) .................. 2018-126170

(51) Int. Cl.
*H01L 27/146* (2006.01)
*G01T 1/20* (2006.01)
*G01T 1/24* (2006.01)

(52) U.S. Cl.
CPC .............. *G01T 1/20* (2013.01); *G01T 1/2002* (2013.01); *G01T 1/2018* (2013.01); *G01T 1/247* (2013.01); *H01L 27/1462* (2013.01); *H01L 27/14612* (2013.01); *H01L 27/14623* (2013.01); *H01L 27/14663* (2013.01)

(58) Field of Classification Search
CPC ......... G01T 1/20; G01T 1/2002; G01T 1/247; H01L 27/14612; H01L 27/1462; H01L 27/14663
See application file for complete search history.

(56) References Cited

U.S. PATENT DOCUMENTS

| | | | | |
|---|---|---|---|---|
| 6,465,824 B1* | 10/2002 | Kwasnick | ......... | H01L 27/14603 257/233 |
| 10,840,467 B2* | 11/2020 | Hirose | .................. | H01L 27/307 |
| 2016/0380021 A1* | 12/2016 | Ito | .......................... | G01T 1/202 257/428 |
| 2017/0139056 A1 | 5/2017 | Tomiyasu et al. | | |
| 2019/0267429 A1* | 8/2019 | Zhang | .................. | H01L 27/307 |

FOREIGN PATENT DOCUMENTS

WO 2016/002563 A1 1/2016

* cited by examiner

*Primary Examiner* — Mark R Gaworecki
(74) *Attorney, Agent, or Firm* — Nixon & Vanderhye

(57) ABSTRACT

An image sensor includes: a switching element disposed on a substrate; a photoelectric conversion element connected to the switching element; a first protective film directly covering the photoelectric conversion element; and a first organic film formed at a layer above the switching element, the first organic film being in contact with the first protective film, wherein the first organic film covers a first end portion of the photoelectric conversion element, the first end portion being at least a part of an end portion of the photoelectric conversion element, wherein the first organic film has a first covering portion at an end of the first organic film, wherein the first covering portion covers the first end portion, wherein the first covering portion is inclined down towards the photoelectric conversion element, and wherein the first organic film covers only the first end portion of the photoelectric conversion element.

12 Claims, 12 Drawing Sheets

IMAGE SENSOR

CROSS-REFERENCE TO RELATED APPLICATION

This Non-provisional application claims priority under 35 U.S.C. § 119(a) on Patent Application No. 2018-126170 filed in Japan on Jul. 2, 2018, the entire contents of which is hereby incorporated by reference.

BACKGROUND

The present disclosure relates to an image sensor.

Flat panel detectors (FPDs) are widely used for an indirect-type X-ray image capturing device. The FPD includes an X-ray-to-light conversion film called a scintillator and a photodiode array. The photodiode array is a device in which light-receiving elements each including a thin-film transistor (or TFT) and a photodiode connected to each other are arranged in a matrix. In the photodiode array, light is converted to electricity in the photodiode, and the obtained electrical charges are read out from a signal line via the TFT to generate an image.

Patent Document 1 (WO2016/002563 A) discloses an X-ray image capturing device. In the X-ray image capturing device of Patent Document 1, the second insulating film is formed over the first insulating film and a conversion element that includes a photodiode and an electrode. In the image capturing panel of Patent Document 1, the second insulating film is formed of a material indicated by SiNxOy, where x is greater than zero and y is zero or greater.

SUMMARY

In efforts of developing FPDs with high image quality, a technology to improve the image sharpness is strongly demanded. However, with the technology disclosed in Patent Document 1, because the travelling direction of the light signal from the scintillator is not necessarily vertical to the light receiving surface, it is possible that light enters other pixels than the pixel that was to receive light (surrounding pixels, for example). This light becomes noise light for the surrounding pixels, and causes an image obtained by the image sensor to blur, or in other words, the sharpness of the image deteriorates.

In the technology of Patent Document 1, even when X-ray is vertically incident on the scintillator, because the converted light has to travel a certain optical distance to reach the light-receiving surface (to be exact, the amorphous silicon layer of the photodiode in the image capturing panel of Patent Document 1), the light signal is scattered and part of the light signal enters the surrounding pixels. Thus, in order to achieve sharper images, it is necessary to prevent the noise light from entering into each pixel from surrounding pixels.

An aspect of the present disclosure adopts the following constructions in order to solve the above problems. An image sensor includes: a switching element disposed on a substrate; a photoelectric conversion element connected to the switching element; a first protective film directly covering the photoelectric conversion element; and a first organic film formed at a layer above the switching element, the first organic film being in contact with the first protective film, wherein the first organic film covers a first end portion of the photoelectric conversion element, the first end portion being at least a part of an end portion of the photoelectric conversion element, wherein the first organic film has a first covering portion at an end of the first organic film, wherein the first covering portion covers the first end portion, wherein the first covering portion is inclined down towards the photoelectric conversion element, and wherein the first organic film covers only the first end portion of the photoelectric conversion element.

It is to be understood that both the foregoing general description and the following detailed description are exemplary and explanatory and are not restrictive of this disclosure.

BRIEF DESCRIPTION OF THE DRAWINGS

The present disclosure can be appreciated by the description which follows in conjunction with the following figures, wherein.

DETAILED DESCRIPTION OF THE PREFERRED EMBODIMENTS

Figure 1:
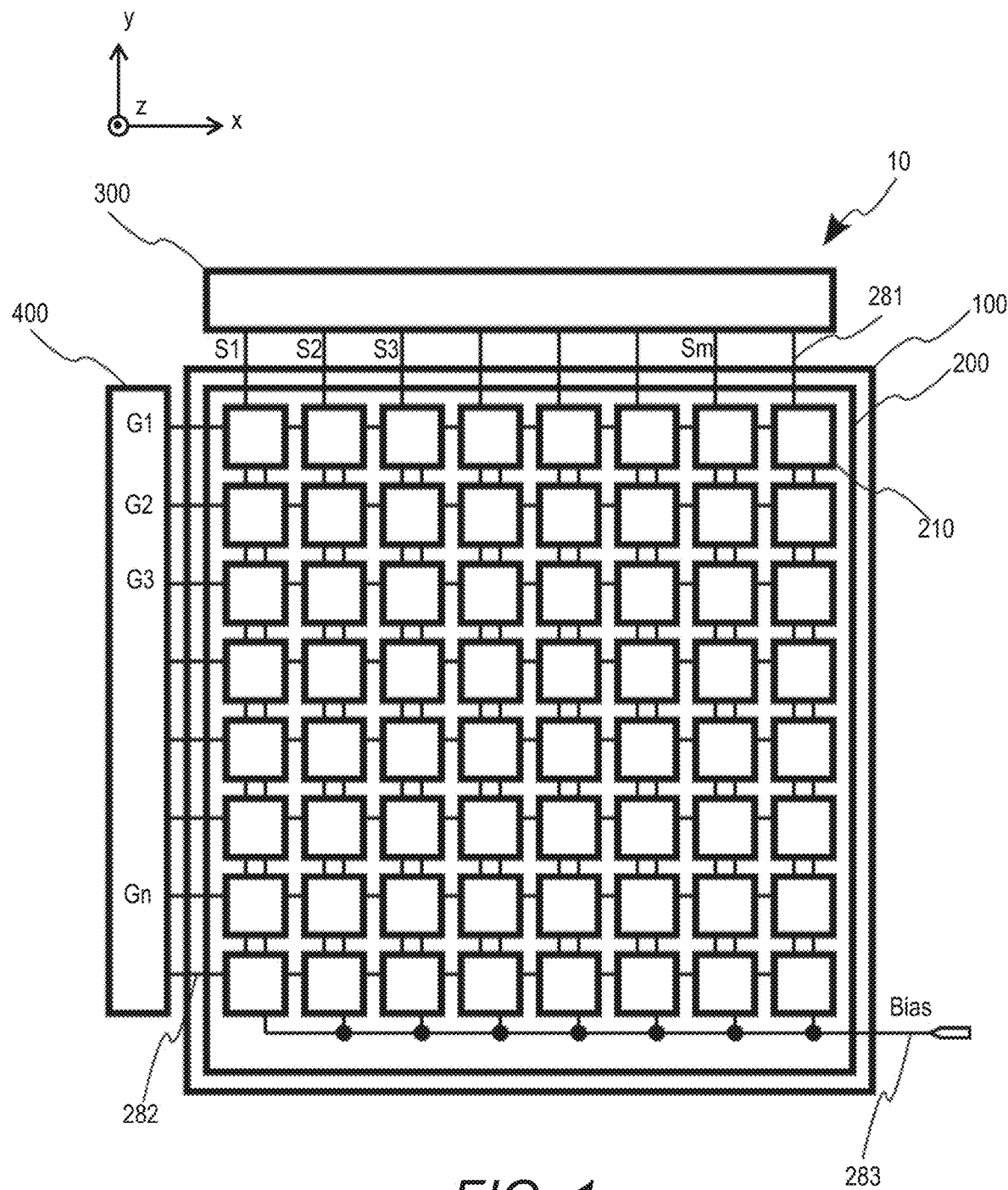
FIG. 1 is a block diagram illustrating a configuration example of an image sensor.

Hereinafter, embodiments are described with reference to the accompanying drawings. It should be noted that the embodiments are merely examples to implement this disclosure and are not to limit the technical scope of this disclosure. Elements common to the drawings are denoted by the same reference signs. Elements in the drawings may not be consistent with the actual size or proportion.

Embodiment 1

FIG. 1 is a block diagram illustrating a configuration example of an image sensor of this embodiment. The image sensor 10 includes a photodiode array 200, a scanning circuit 400, and a detection circuit 300.

In the photodiode array 200, pixels 210 disposed at respective intersections of signal lines 281 (S1-Sm) running in the vertical direction and gate lines 282 (G1-Gn) running in the horizontal direction are arranged in a matrix. The signal lines 281 (S1-Sm) are connected to different pixel columns, respectively. The gate lines 282 (G1-Gn) are connected to different pixel rows, respectively.

Although not illustrated in FIG. 1, the image sensor 10 includes a scintillator 500 described below. The scintillator 500 is arranged in the Z-axis direction of the photodiode array 200 and covers the photodiode array 200. An X-ray radiated to an object passes through the object and enters the scintillator 500, and the scintillator 500 converts the X-ray to light. The light converted by the scintillator 500 then enters the photodiode array 200. The image sensor 10 does not necessarily have to include the scintillator 500.

In this embodiment, the row direction and the column direction of the matrix of the pixels 210 are respectively the x-axis direction and the y-axis direction, and the direction perpendicular to the x-axis and y-axis is the z-axis direction, along which the scintillator 500 is stacked on the photodiode array 200.

A sensor substrate 100 is an insulating substrate (glass substrate, for example). The signal lines 281 (S1-Sm) are connected to the detection circuit 300, and the gate lines 282 (G1-Gn) are connected to the scanning circuit 400. In this example, all of the pixels 210 are connected to a common bias line 283 (bias), but it is also possible that all pixels 210 and the common bias line 283 are divided into a plurality of pixel areas, and an independent bias line and bias terminal are arranged for each pixel area.

Figure 2:
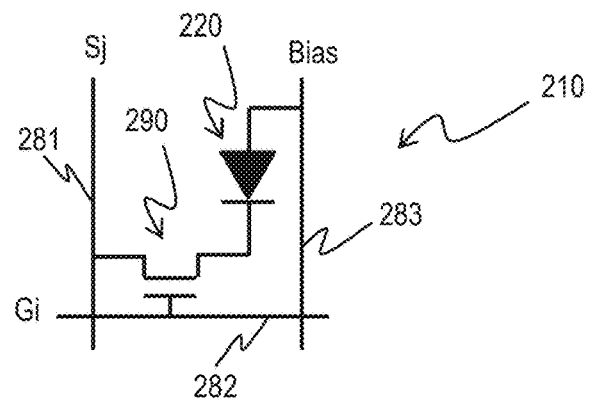
FIG. 2 is a circuit diagram illustrating a circuit configuration example of a pixel that can be applied to the image sensor.

FIG. 2 is a circuit diagram illustrating a circuit configuration example of a pixel 210 that can be applied to the image sensor 10 of this embodiment. The pixel 210 of FIG. 2 is the pixel 210 of the i-th row from the top and the j-th column from the left in FIG. 1. The pixel 210 includes a photodiode 220 and a TFT 290. The photodiode 220 is an example of a photoelectric conversion element. The TFT 290 is an example of a switching element. The photodiode 220 may be replaced with a different photoelectric conversion element, and the TFT 290 may be replaced with a different switching element.

The gate terminal of the TFT 290 is connected to the gate line Gi, the drain terminal is connected to the signal line Sj, and the source terminal is connected to the cathode terminal of the photodiode 220. In the example of FIG. 2, the anode terminal of the photodiode 220 is connected to the bias line 283 (Bias).

The scanning circuit 400 selects a pixel row in the photodiode array 200, and outputs an output signal to the pixels 210 of the selected pixel row through the gate line 282, thereby turning on each TFT 290. The detection circuit 300 detects a signal from the photodiode 220 of each pixel 210 of the row selected by the scanning circuit 400 through the TFTs 290 in the ON state and the signal line 281.

Next, the overview of the photodiode array 200 will be explained with reference to FIGS. 3 to 5. For ease of explanation, part of the configuration of the photodiode array 200 may be omitted from FIGS. 3 to 5. For example, the second protective film 250, the third protective film 260, the second organic film 270, and the like, which will be explained below, are not illustrated in FIG. 3.

Figure 3:
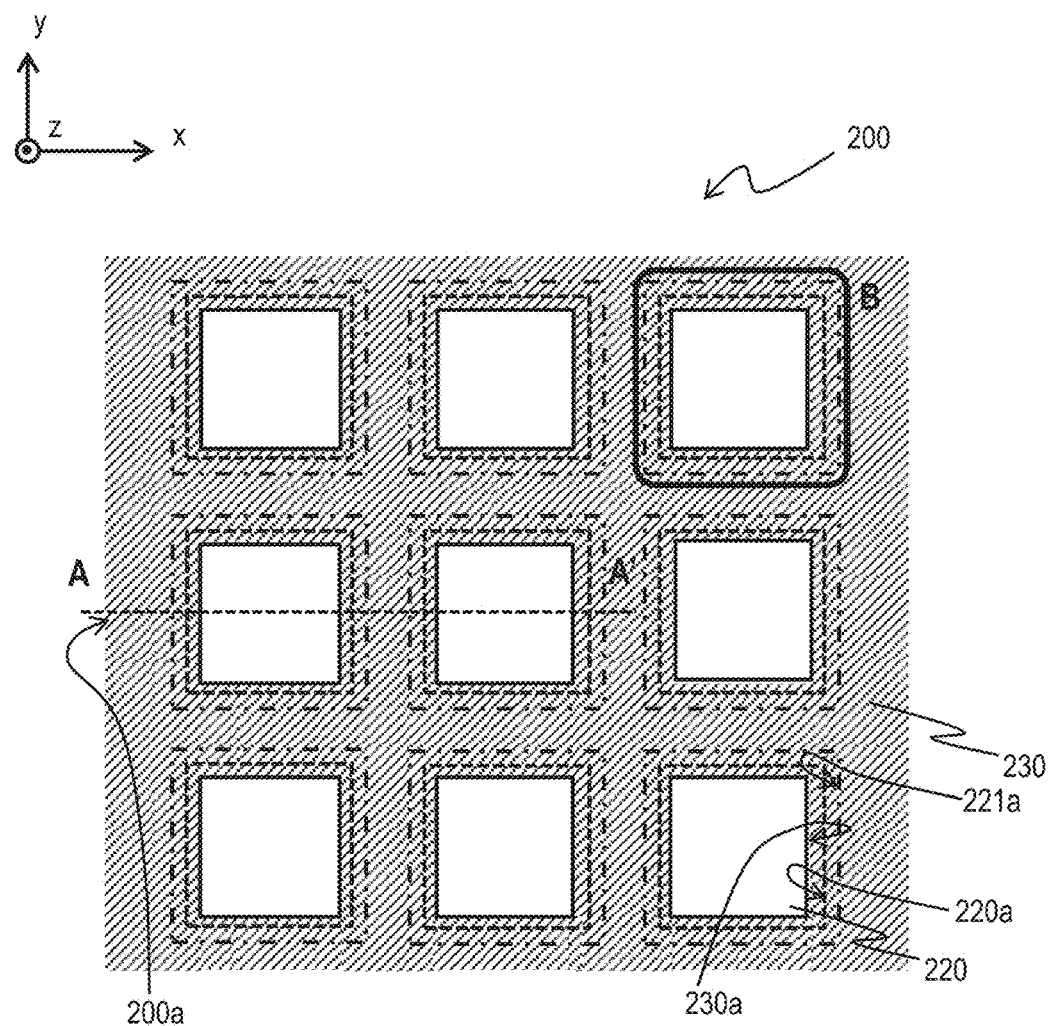
FIG. 3 is a schematic diagram illustrating an example of a top surface of a photodiode array.

FIG. 3 is a schematic diagram illustrating an example of the top surface of the photodiode array 200. The photodiode array 200 includes the photodiodes 220, the first organic film 230, the first protective film 240, and the second protective film 250. As described above, in the photodiode array 200, the photodiodes 220 are arranged in a matrix. The first organic film 230 is arranged in a grid shape to fill the gaps between the photodiodes 220.

Figure 4:
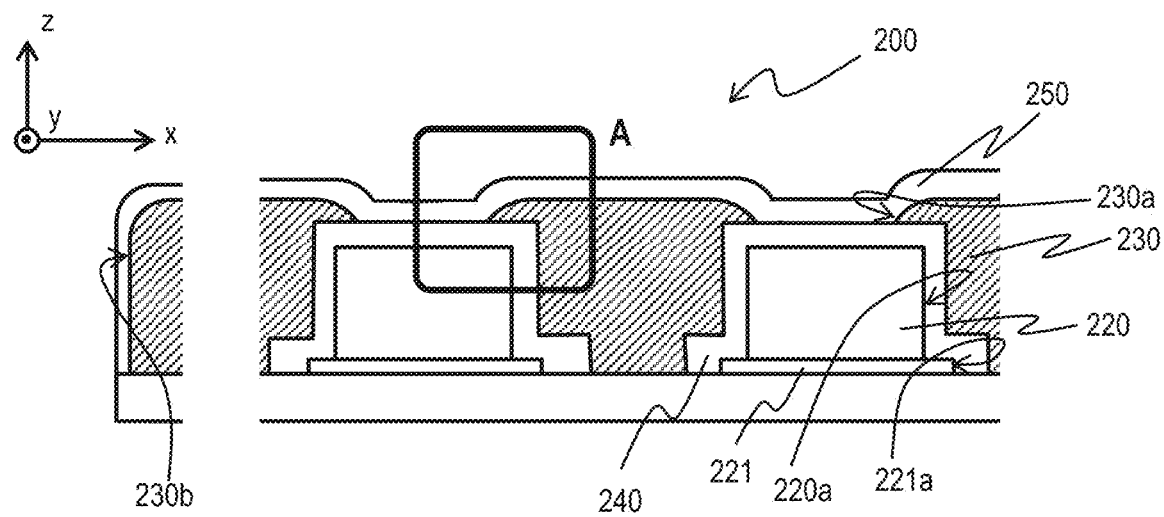
FIG. 4 is a schematic diagram illustrating an example of a cross-section of the photodiode array, taken along a line A-A' of FIG. 3.

FIG. 4 is a schematic diagram illustrating an example of the cross-section of the photodiode array 200, taken along the line A-A' of FIG. 3. Each of the photodiodes 220 includes a lower electrode 221 disposed at a lower part thereof. An end portion 221a of the lower electrode 221 is located outside an end portion 220a of a part of the photodiode 220 excluding the lower electrode 221 (will simply be referred to as an end portion 220a of the photodiode 220). The first protective film 240 is formed directly over each photodiode 220.

The first organic film 230 is formed between two adjacent first protective films 240. Specifically, the first organic film 230 fills a gap between two adjacent first protective films 240, for example. An end portion 230a of the first organic film 230 is located inside the end portion 220a of the photodiode 220. The end portion 230a of the first organic film 230 is inclined down toward the negative z-axis direction (or the direction toward the photodiode 220).

The end portion 230a of the first organic film 230 needs to be located directly above (positive z-axis direction) at least a part of the end portion 220a (outer periphery) on the top surface of the photodiode 220. In the example of FIG. 3, the end portion 230a of the first organic film 230 is located inside the entire end portion 220a (outer periphery) of the photodiode 220 on the x-y plane. At least a part of the top surface of the photodiode 220 does not have the first organic film 230 thereon.

In the example of FIGS. 3 and 4, the center part of the top surface of the photodiode 220 does not have the first organic film 230 thereon. It is preferable that the area of a portion where the first organic film 230 and the photodiode 220 overlap with each other in the z-axis direction be sufficiently smaller than the area of a portion of the photodiode 220 that does not overlap with the first organic film 230 in the z-axis direction.

The second protective film 250 is formed directly over the first organic film 230 and the first protective films 240. Thus, in the areas where the first organic film 230 does not exist directly on the top surface of the photodiode 220, the second protective film 250 is formed on the first protective film 240.

The second protective film 250 is formed to follow the surface profile of the first organic film 230 and the first protective film 240, and therefore, each portion thereof immediately on the end portion 230a of the first organic film 230 is inclined down toward the negative z-axis direction (or toward the photodiode 220). The photodiode array 200 preferably, but not necessarily, includes the second protective film 250.

The first organic film 230 is made of an organic resin material such as an acrylic resin, a phenolic resin, or an epoxy resin, for example. The first protective film 240 and the second protective film 250 are made of an insulating inorganic film such as SiOxNy (x and y are zero or any natural number), for example.

Figure 5:
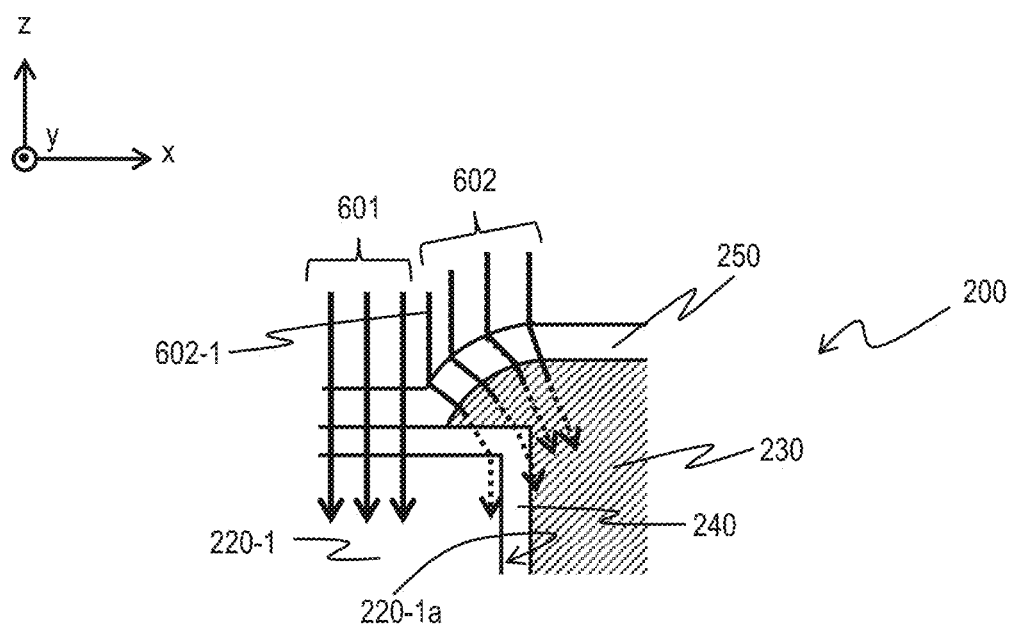
FIG. 5 is a partial enlarged view illustrating an example of Part A of FIG. 4.

FIG. 5 is a partial enlarged view illustrating an example of Part A of FIG. 4. In a case where the second protective film 250 exists on the paths of incident light 601 and incident light 602 of FIG. 5, the second protective film 250 has a higher refractive index than that of the other medium that receives light immediately before the second protective film 250. In a case where the second protective film 250 does not exist, the third protective film 260 (in this case, the third protective film 260 has the same optical function as that of the second protective film 250) is located on the end portion 230a of the first organic film 230, and thus, the third protective film 260 has a higher refractive index than the other medium that receives light immediately before the third protective film 260.

When neither the second protective film 250 nor the third protective film 260 is provided, the end portion 230a of the first organic film 230 has a higher refractive index than the other medium that receives light immediately before the end portion 230a. If there is no other medium that receives light immediately before the second protective film 250, the third protective film 260, or the end portion 230a, air is regarded as the other medium (refractive index 1.0).

The thermal expansion rate of the first organic film 230 of FIG. 4 differs greatly from the thermal expansion rate of the first protective film 240, which is an inorganic film, and the second protective film 250 or the third protective film 260 (described as the second protective film 250 in FIG. 4 and FIG. 5 described later), which is also an inorganic film. On the other hand, the thermal expansion rate of the first protective film 240 and the thermal expansion rate of the second protective film 250 or the third protective film 260 have a smaller difference therebetween. Thus, the first organic film 230 is not formed directly on the center part of the top surface of the photodiode 220, and the second protective film 250 or the third protective film 260 is directly layered on the first protective film 240.

That is, because the second protective film 250 or third protective film 260 is formed directly on the first protective film 240 in the center portion of the photodiode 220, and the thermal expansion rates of both films do not significantly differ from each other, those films are less likely to be affected by temperature change in the manufacturing process. As a result, film separation or crack is less likely to occur in the first protective film 240 and the second protective film 250 or the third protective film 260. This makes the photodiode array 200 stronger against humidity, and thus improves the reliability of the photodiode array 200.

The first protective film 240 and the second protective film 250 or third protective film 260 are made of the same or similar material, and therefore, the first protective film 240 is securely adhered to the second protective film 250 or third protective film 260 in the area where the second protective film 250 or third protective film 260 is directly formed on the first protective film 240. Thus, the film separation or film peeling is less likely to occur, and as a result, image unevenness is suppressed.

The first organic film 230 is also formed outside the outermost photodiode 220 on the x-y plane, but because an end portion 230b of the first organic film 230 located outside the outermost photodiode 220 is sealed by the second protective film 250 or third protective film 260, moisture does not enter through the end portion 230b, and as a result, corrosion of wiring of the photodiode array 200 and property deterioration of the photodiode 220 and the TFT 290 can be prevented. An end portion of the first organic film 230 in the y-axis direction of the photodiode array 200 is also sealed by the second protective film 250 or third protective film 260.

The photodiode 220 illustrated in FIG. 5 is referred to as a photodiode 220-1 to be differentiated from other photodiodes 220. The incident light 601 and the incident light 602 are light that enters from the scintillator 500 to the photodiode array 200. Generally, the wavelength of the light coming from the scintillator is visible light, and the center wavelength of CsI:Tl, which is a type of the scintillator, is approximately 550 nm, for example.

The incident light 601 is mainly made of optical components that need to enter the photodiode 220-1 (light coming from a portion of the scintillator 500 located immediately above the photodiode 220-1, for example). The incident light 602 is mainly made of optical components that should not enter the photodiode 220-1 (light coming from portions of the scintillator 500 that does not overlap the photodiode 220-1, that is, light that needs to enter other photodiodes 220 (photodiodes 220 of surrounding pixels such as adjacent pixels 210), for example).

Most of the optical components of the incident light 601 directly enter the photodiode 220-1. On the other hand, the optical components of the incident light 602 that should not enter the photodiode 220-1 come from portions of the scintillator 500 that overlap adjacent pixels 210, for example, and thus have a greater incident angle, and those optical components are likely to enter from areas near the end portion 220-1a of the photodiode 220-1. As described above, the refractive index of the second protective film 250 or third protective film 260 is higher than the refractive index of the other medium through which the light passes immediately before the second protective film 250 or third protective film 260.

Thus, at least part of the incident light 602 refracts at the inclined portion of the second protective film 250 or third protective film 260, and the first organic film 230, and does not reach the photodiode 220-1. This makes it possible to block the light from entering each pixel 210 from adjacent pixels 210. As a result, the blurring of images that was caused by the light from adjacent pixels 210 is suppressed, and the image sharpness is improved.

The first organic film 230 may have the light absorption property in the wavelength range of 380 nm to 700 nm, for example. The incident light 602-1, which is part of the incident light 602, refracts at the inclined portion of the first organic film 230, but still enters the photodiode 220-1 through the first organic film 230. However, because the first organic film 230 has the light absorption property, the intensity of the incident light 602-1 that enters the photodiode 220-1 is attenuated by the first organic film 230, which further improves the image sharpness.

Figure 6:
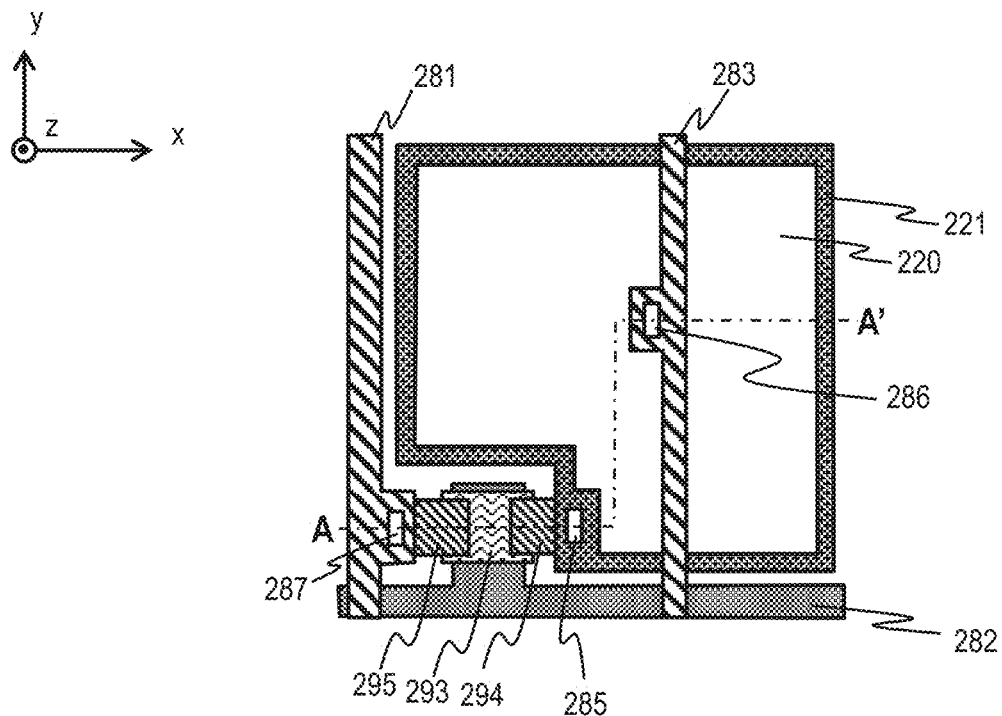
FIG. 6 is a partial enlarged view illustrating an example of Part B of FIG. 3 (not including a first organic film)
Figure 7:
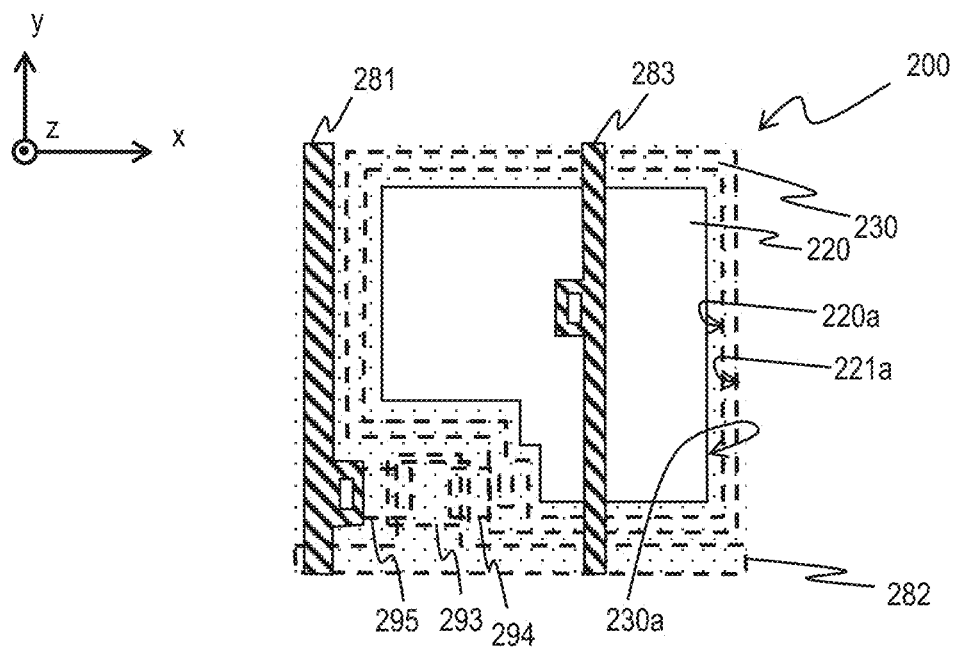
FIG. 7 is a partial enlarged view illustrating an example of Part B of FIG. 3 (including the first organic film)
Figure 8:
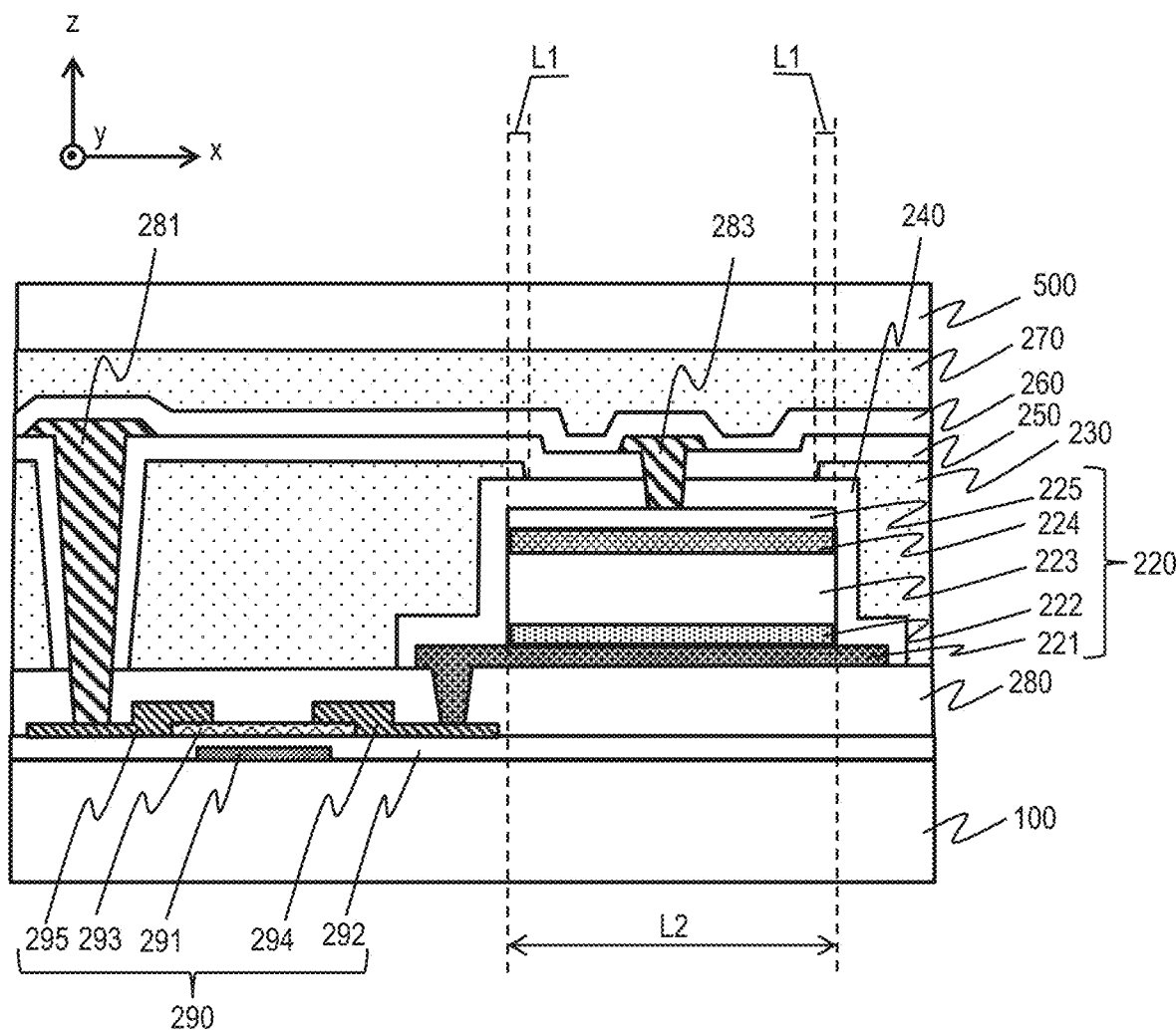
FIG. 8 is a cross-sectional view illustrating the first example of a cross-section of the photodiode array, taken along the line A-A' of FIG. 6.

Next, the configuration of the photodiode array 200 will be explained in detail with reference to FIGS. 6 to 8. FIG. 6 is a partial enlarged view illustrating an example of Part B of FIG. 3 (not including the first organic film 230). FIG. 7 is a partial enlarged view illustrating an example of Part B of FIG. 3 (including the first organic film 230). FIG. 8 is a cross-sectional view illustrating the first example of the cross-section of the photodiode array 200, taken along the line A-A' of FIG. 6. FIG. 8 also illustrates the scintillator 500 that covers the photodiode array 200, and the sensor substrate 100 immediately below the photodiode array 200. Furthermore, FIG. 8 illustrates the second protective film 250, the third protective film 260, the second organic film 270, and the like.

A TFT 290 is arranged on the sensor substrate 100. The TFT 290 includes a gate electrode 291, a gate insulating film 292, a semiconductor layer 293, a source electrode 294, and a drain electrode 295. The gate electrode 291 is disposed on the sensor substrate 100, and the gate insulating film 292 is stacked on the sensor substrate 100 to directly cover the gate electrode 291.

The semiconductor layer 293 is formed above the gate electrode 291 with the gate insulating film 292 interposed therebetween. The source electrode 294 and the drain electrode 295 are formed on the gate insulating film 292. The source electrode 294 is connected to an end portion of the semiconductor layer 293 in the positive x-axis direction. The drain electrode 295 is connected to an end portion of the semiconductor layer 293 in the negative x-axis direction. The source electrode 294 and the drain electrode 295 are separated from each other.

The gate electrode 291 is made of Al, Cr or an alloy of those metals, for example. The gate insulating film 292 is made of SiOxNy (x and y are zero or any natural number), $Al_2O_3$, or a multilayer film of those, for example. The semiconductor layer 293 is made of a-Si (amorphous silicon) or poly-silicon, or a metal oxide such as In, Ga, Zn, and Sn, for example. The drain electrode 295 is made of a metal with low resistance rate such as an alloy of Al, Mo, and Ti, for example.

The thickness (unless otherwise specified, "thickness" means the thickness in the z-axis direction) of the gate electrode 291 is approximately 100 to 1000 nm, for example. The thickness of the gate insulating film 292 is approximately 200 to 600 nm, for example. The thickness of the semiconductor layer 293 is approximately 10 to 500 nm, for example. The thickness of the source electrode 294 and the drain electrode 295 is approximately 100 to 1000 nm, for example.

A TFT protective film 280 is formed over the semiconductor layer 293, the source electrode 294, and the drain electrode 295. The TFT protective film 280 is made of an insulating inorganic film such as SiOxNy (x and y are zero or any natural number) or $Al_2O_3$, for example. The thickness of the TFT protective film 280 is approximately 100 to 2000 nm, for example.

The photodiode 220 and the first organic film 230 are arranged on the TFT protective film 280. The thickness of the first organic film 230 is approximately 500 to 2500 nm, for example. The photodiode 220 is constituted of a lower electrode 221, an n-type a-Si layer 222, an i-type a-Si layer 223, a p-type a-Si layer 224, and an upper electrode 225, which are stacked in this order in the positive z-axis direction, for example.

The lower electrode 221 is formed through the TFT protective film 280 to be connected to the source electrode 294 in a first contact portion 285, for example. The lower electrode 221 may be made of Cr, for example. The upper electrode 225 may be made of a transparent electrode such as ITO (indium Tin oxide), for example. The thickness of the lower electrode 221 is approximately 10 to 200 nm, for example. The thickness of the upper electrode 225 is approximately 10 to 200 nm, for example.

The thickness of the n-type a-Si layer 222 is approximately 10 to 100 nm, for example. The thickness of the i-type a-Si layer 223 is approximately 500 to 2000 nm, for example. The thickness of the p-type a-Si layer 224 is approximately 10 to 100 nm, for example.

In order to reduce the parasitic capacitance between the TFT 290 and the photodiode 220, the TFT 290 and the photodiode 220 are preferably separated from each other as illustrated in FIG. 8. Similarly, in order to reduce the parasitic capacitance between the photodiodes 220, the respective photodiodes 220 are preferably separated from each other.

The first protective film 240 directly covers the photodiode 220. The first organic film 230 is formed between two adjacent first protective films 240. The second protective film 250 is formed directly over the first organic film 230 and the first protective film 240 as described above. The thickness of the first protective film 240 is approximately 50 to 2000 nm, for example. The thickness of the second protective film 250 is approximately 50 to 1000 nm, for example. The second protective film 250 is formed to follow the surface profile of the first organic film 230 and the first protective film 240, and therefore, a portion thereof immediately above the end portion 230a of the first organic film 230 is inclined down toward the negative z-axis direction.

Also, as described above, the end portion 230a of the first organic film 230 is located inside the end portion 220a of the photodiode 220, and the end portion 230a of the first organic film 230 is inclined down in the negative z-axis direction (toward the photodiode 220).

The width L1 of the area where the first organic film 230 and the photodiode 220 overlap is preferably 10 μm or smaller, and is set to 3 μm, for example. The width L2 of the photodiode 220 is 200 μm or smaller, and in some cases, needs to be 100 μm or smaller. L1 is sufficiently smaller than L2. The inclination angle of the end portion 230a of the first organic film 230 is approximately 15 to 75 degrees, for example.

The bias line 283 is arranged on the upper electrode 225. The bias line 283 runs through the first protective film 240 and second protective film 250 to be connected to the upper electrode 225 in a second contact portion 286, for example. The signal line 281 is located on the drain electrode 295.

The signal line 281 runs through the second protective film 250 to be connected to the drain electrode 295 in a third contact portion 287, for example. The first organic film 230 and the signal line 281 are separated by the second protective film 250.

It is preferable that the dielectric constant of the first organic film 230 be small, and the majority of the space between the signal line, the TFT 290, and the photodiode 220 be filled with the first organic film 230. This makes it possible to reduce the parasitic capacitance of the signal line 281. If the parasitic capacitance of the signal line 281 is reduced, the detection circuit 300 can read out the signal rapidly, which improves the pixel response delay of the image sensor 10.

In the example of FIGS. 6 to 8, at least part of the signal line 281 and the bias line 283 is located at a layer higher than the first organic film 230, but the entire signal line 281 and bias line 283 may be located at the same layer as or lower layer than the first organic film 230.

The gate line 282 is located in the negative y-axis direction and arranged along the x-axis direction in the photodiode 220 of FIG. 6, for example. The gate line 282 is connected to the gate electrode 291 on the plane parallel to the z-x plane. The thickness of the signal line 281, gate line 282, and bias line 283 is approximately 100 to 1000 nm, for example.

The third protective film 260 is formed directly over the signal line 281 and the bias line 283. The third protective film 260 is made of an insulating inorganic film such as SiOxNy (x and y are zero or any natural number), for example. The third protective film 260 protects the signal line 281 and the bias line 283. The third protective film 260 is formed to follow the surface profile of the second protective film 250, and is therefore inclined toward the negative z-axis direction immediately above the end portion 230a of the first organic film 230. The third protective film 260 is preferably, but not necessarily, provided.

The second organic film 270 is formed over the third protective film 260. Examples of the second organic film 270 include a planarization film of an organic resin material such as an acrylic resin, a phenol resin, and an epoxy resin, a scintillator protective film such as perylene, and a scintillator adhesive such as an OCA tape (Optical Clear Adhesive tape) and an optical adhesive. The scintillator 500 is placed over the second organic film 270.

The thickness of the third protective film 260 is approximately 50 to 1000 nm, for example. The thickness of the second organic film 270 is approximately 500 to 5000 nm, for example. The thickness of the scintillator 500 is approximately 10 nm to 10 mm, for example. At least one of the third protective film 260 and the second organic film 270 may be omitted from the photodiode array 200.

Figure 9:
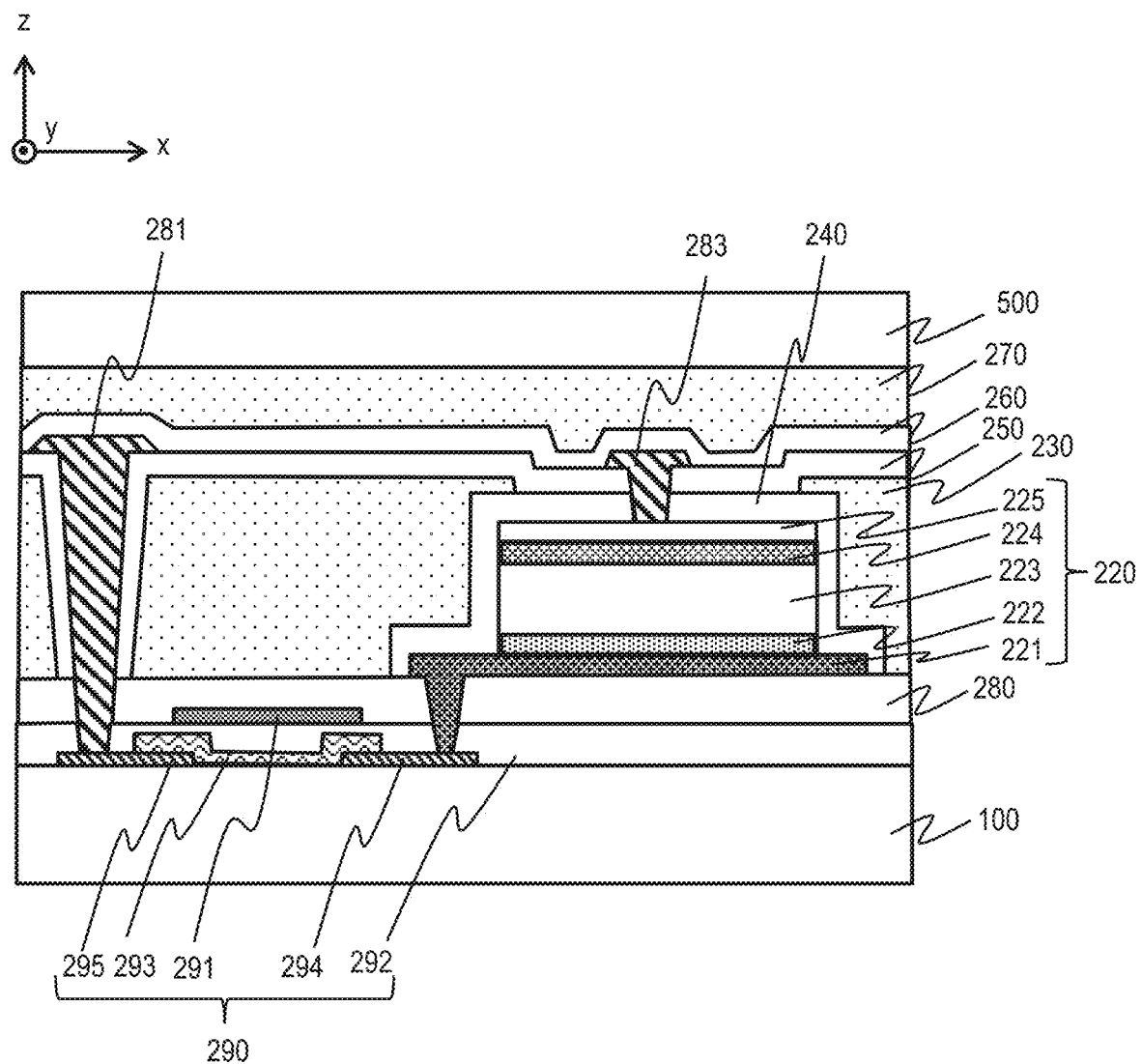
FIG. 9 is a cross-sectional view illustrating the second example of a cross-section of the photodiode array, taken along the line A-A' of FIG. 6.

FIG. 9 is a cross-sectional view illustrating the second example of the cross-section of the photodiode array 200, taken along the line A-A' of FIG. 6. The difference between FIG. 8 and FIG. 9 will be discussed below. In the example of FIG. 8, the TFT 290 is of an inverted-staggered type, but in the example of FIG. 9, the TFT 290 is of a staggered type. The greatest difference between the staggered type and the inverted staggered type is the positional relationship between the semiconductor layer 293 and the gate electrode 291.

The semiconductor layer 293, the source electrode 294, and the drain electrode 295 are formed on the sensor substrate 100. The source electrode 294 is connected to an end portion of the semiconductor layer 293 in the positive x-axis direction. The drain electrode 295 is connected to an end portion of the semiconductor layer 293 in the negative x-axis direction.

The TFT protective film 292 is formed over the semiconductor layer 293, the source electrode 294, and the drain electrode 295. The gate electrode 291 is formed above the semiconductor layer 293 with the gate insulating film 292 interposed therebetween. The TFT protective film 280 is formed over the gate electrode 291.

Figure 10:
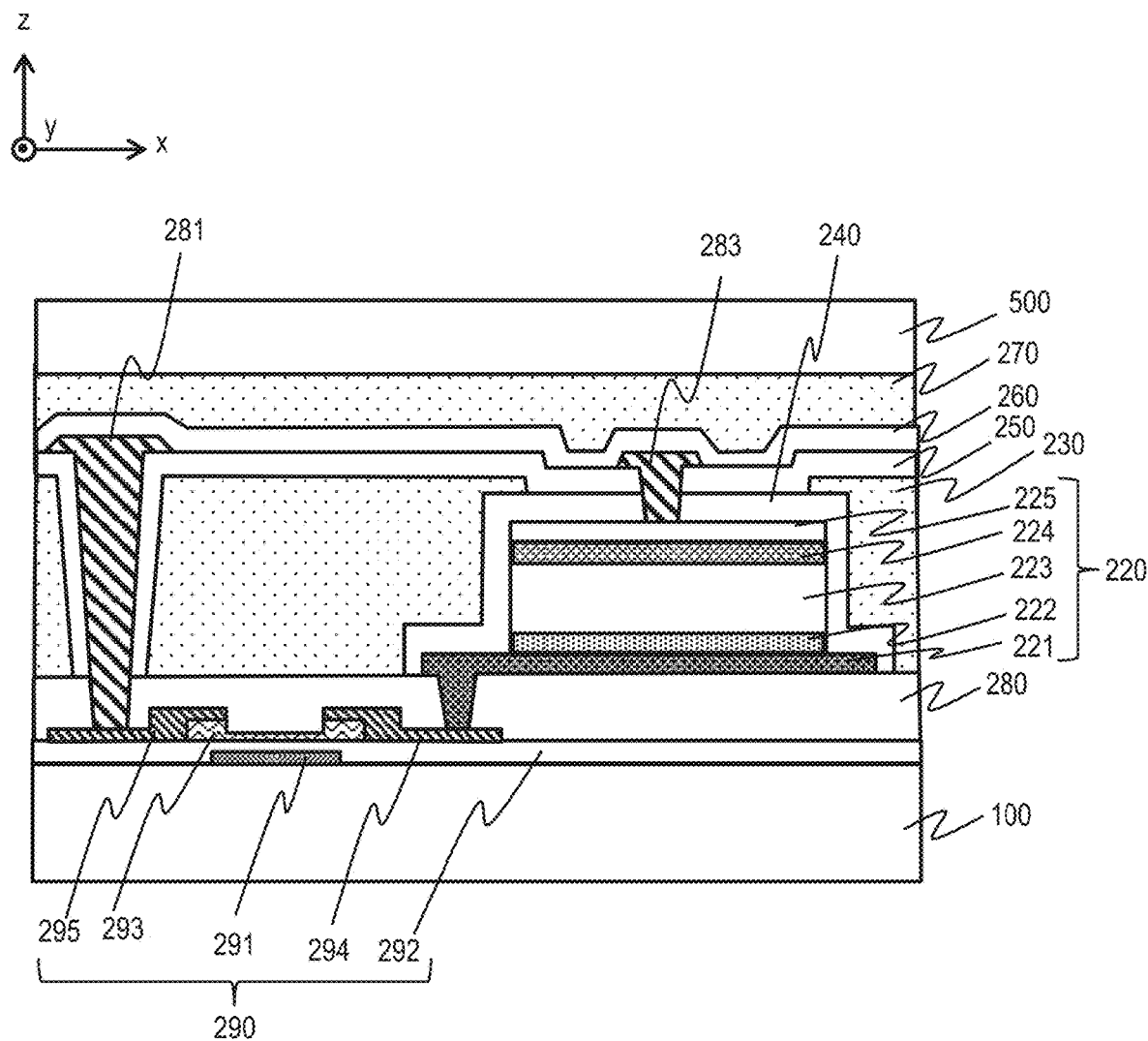
FIG. 10 is a cross-sectional view illustrating the third example of a cross-section of the photodiode array, taken along the line A-A' of FIG. 6.

FIG. 10 is a cross-sectional view illustrating the third example of the cross-section of the photodiode array 200, taken along the line A-A' of FIG. 6. The difference between FIG. 8 and FIG. 10 will be discussed below. In the example of FIG. 10, the connection between the semiconductor layer 293 and the source electrode 294 and drain electrode 295 is of the channel-etch type. The semiconductor layer 293 has a recess in the center portion of the top surface in the x-axis direction (or y-axis direction).

Figure 11:
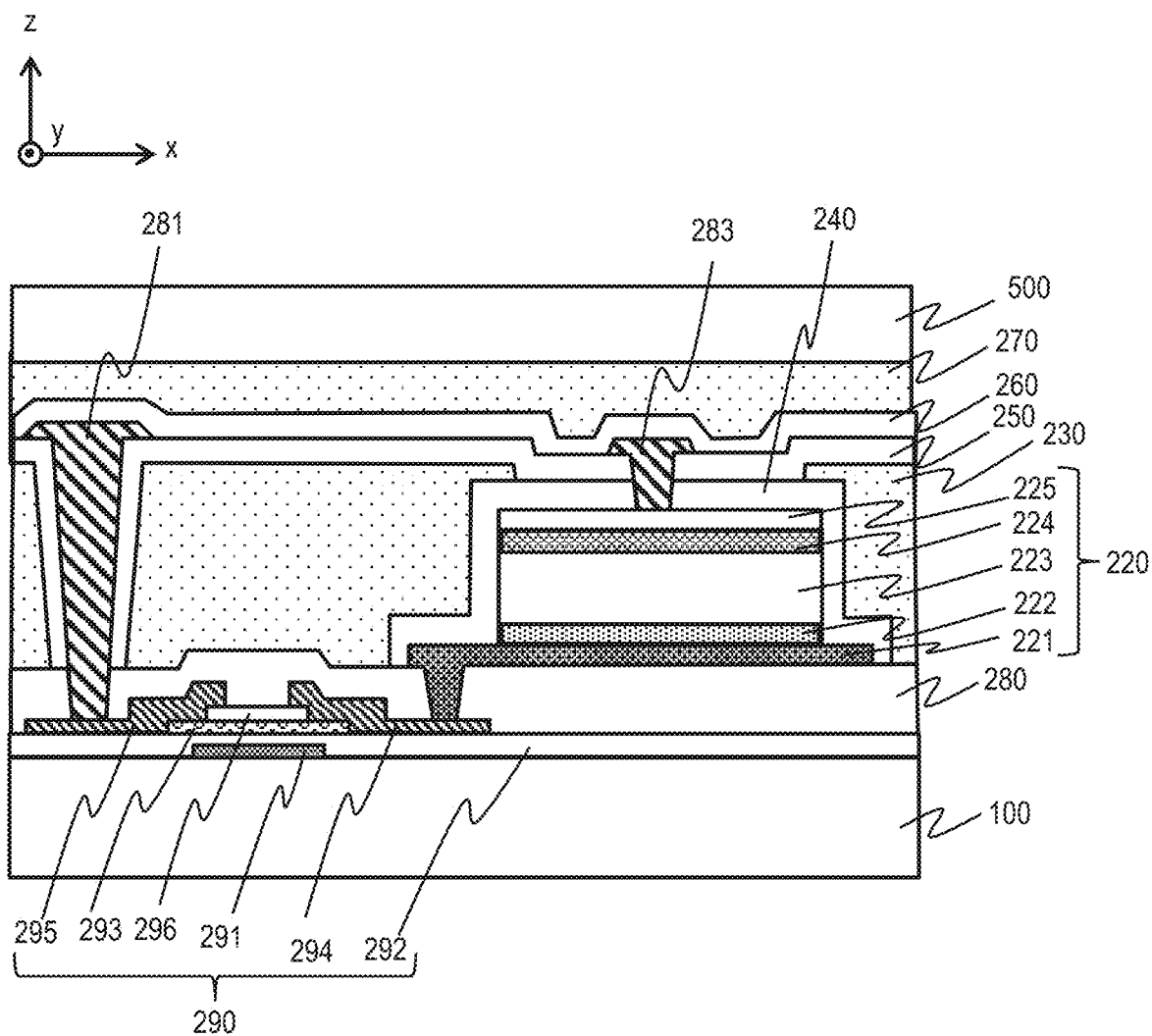
FIG. 11 is a cross-sectional view illustrating the fourth example of a cross-section of the photodiode array, taken along the line A-A' of FIG. 6.

FIG. 11 is a cross-sectional view illustrating the fourth example of the cross-section of the photodiode array 200, taken along the line A-A' of FIG. 6. The difference between FIG. 8 and FIG. 11 will be discussed below. In the example of FIG. 11, the connection between the semiconductor layer 293 and the source electrode 294 and drain electrode 295 is of the channel protection type. The TFT 290 further includes an etch-stopper layer.

An island-shaped etch stopper layer 296 is arranged in the center portion of the x-axis direction (or y-axis direction) of the semiconductor layer 293. The source electrode 294 is in contact with one end portion of the etch stopper layer 296 in the positive x-axis direction. The drain electrode 295 is in contact with the other end portion of the etch stopper layer 296 in the negative x-axis direction. The etch stopper layer 296 is made of an insulating inorganic film such as SiOxNy (x and y are zero or any natural number) or $Al_2O_3$, for example. The thickness of the etch stopper layer 296 is approximately 10 to 500 nm, for example.

Figure 12:
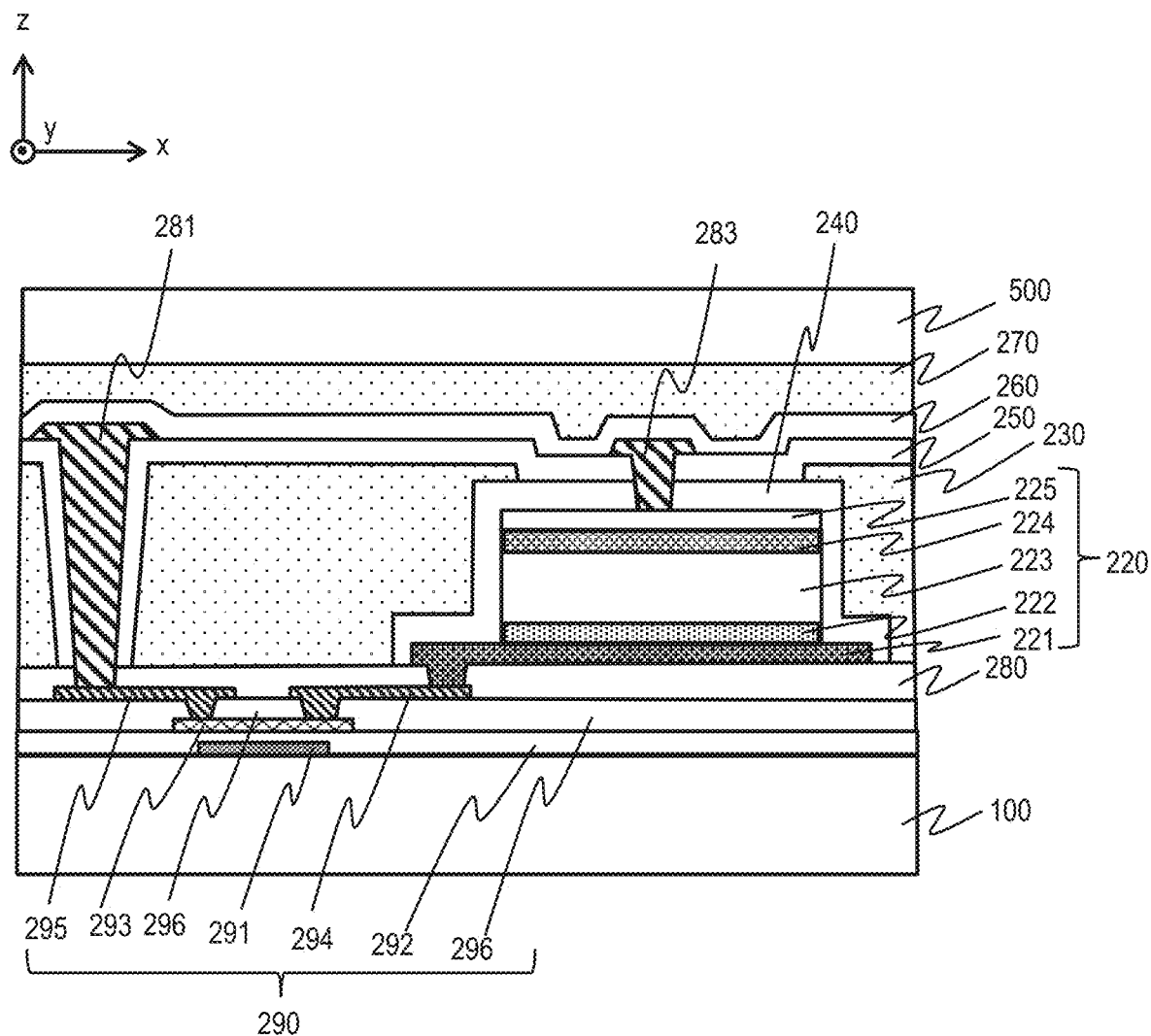
FIG. 12 is a cross-sectional view illustrating the fifth example of a cross-section of the photodiode array, taken along the line A-A' of FIG. 6.

FIG. 12 is a cross-sectional view illustrating the fifth example of the cross-section of the photodiode array 200, taken along the line A-A' of FIG. 6. The difference between FIG. 11 and FIG. 12 will be discussed below. In the example of FIG. 12, the connection between the semiconductor layer 293 and the source electrode 294 and drain electrode 295 is of the contact type.

The etch stopper layer 296 is formed over the semiconductor layer 293. The source electrode 294 and the drain electrode 295 are formed on the etch stopper layer 296. The source electrode 294 and the drain electrode 295 run through the etch stopper layer 296 to be connected to the semiconductor layer 293.

Figure 13:
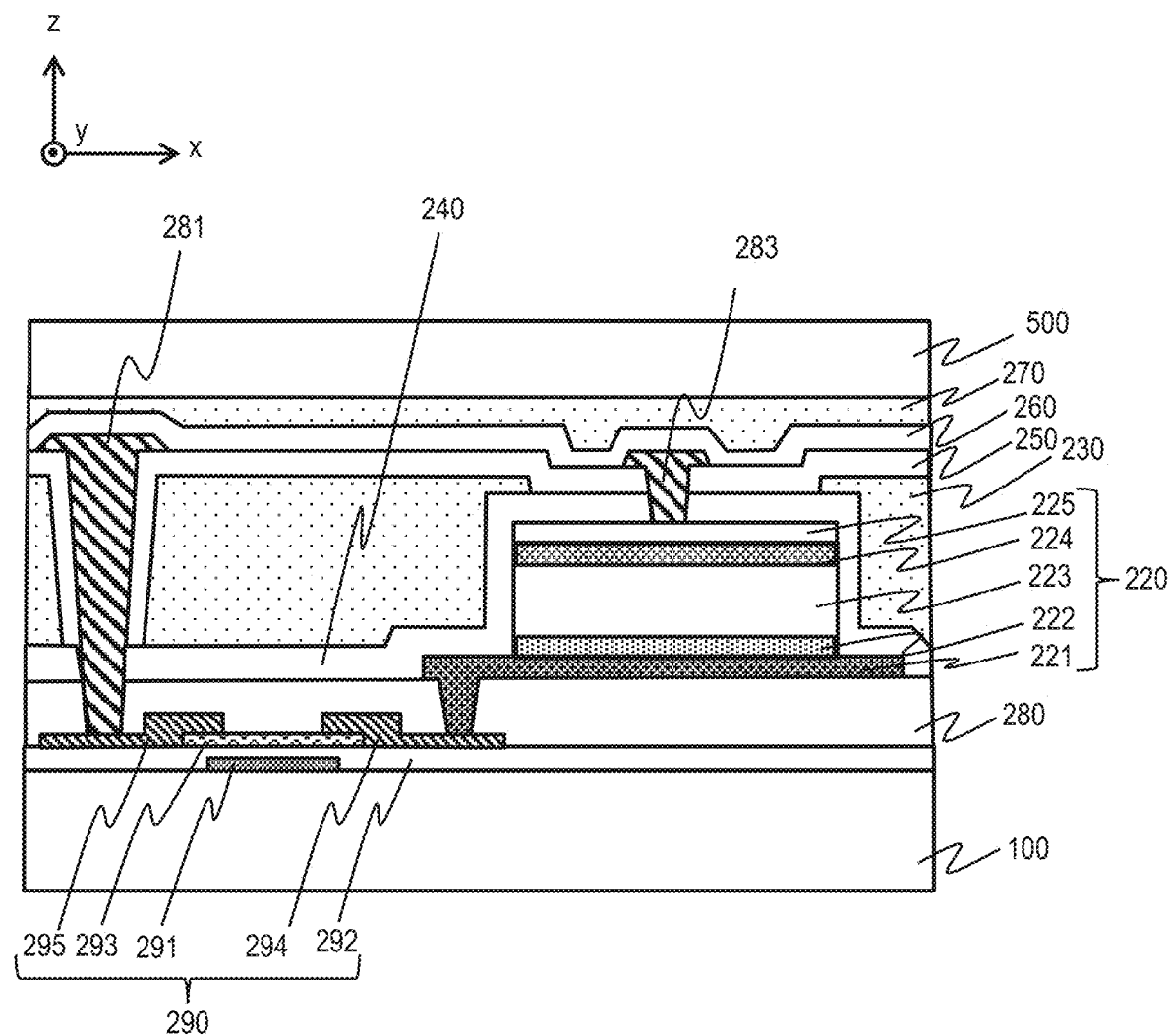
FIG. 13 is a cross-sectional view illustrating the sixth example of a cross-section of the photodiode array, taken along the line A-A' of FIG. 6.

FIG. 13 is a cross-sectional view illustrating the sixth example of the cross-section of the photodiode array 200, taken along the line A-A' of FIG. 6. The difference between FIG. 8 and FIG. 13 will be discussed below. In the example of FIG. 8, the individual first protective films 240 separated from each other cover the respective photodiodes 220.

On the other hand, in the example of FIG. 13, the first protective film 240 formed in one-piece covers all of the photodiodes 220. That is, in the example of FIG. 13, the first protective films 240 illustrated in FIG. 4 are connected to each other. By using the first protective films 240 connected to each other, the process to remove portions of the first protective films 240 that do not overlap the photodiodes 220 is no longer necessary in the manufacturing process of the photodiode array 200, which improves the manufacturing efficiency.

Figure 14:
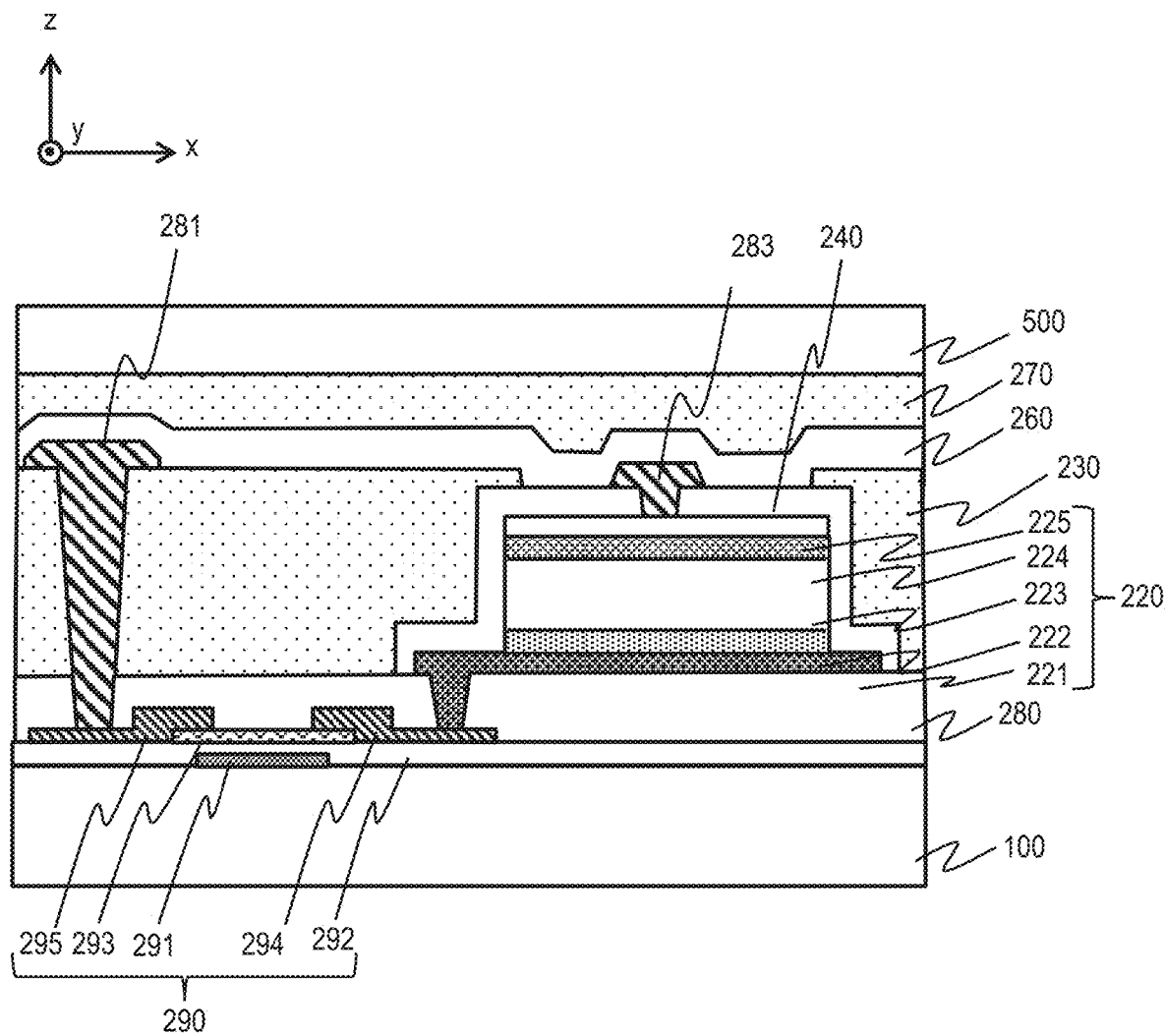
FIG. 14 is a cross-sectional view illustrating the seventh example of a cross-section of the photodiode array, taken along the line A-A' of FIG. 6.

FIG. 14 is a cross-sectional view illustrating the seventh example of the cross-section of the photodiode array 200, taken along the line A-A' of FIG. 6. The cross-sectional view of FIG. 14 is the same as FIG. 8 except that the photodiode array 200 does not include the second protective film 250.

Figure 15:
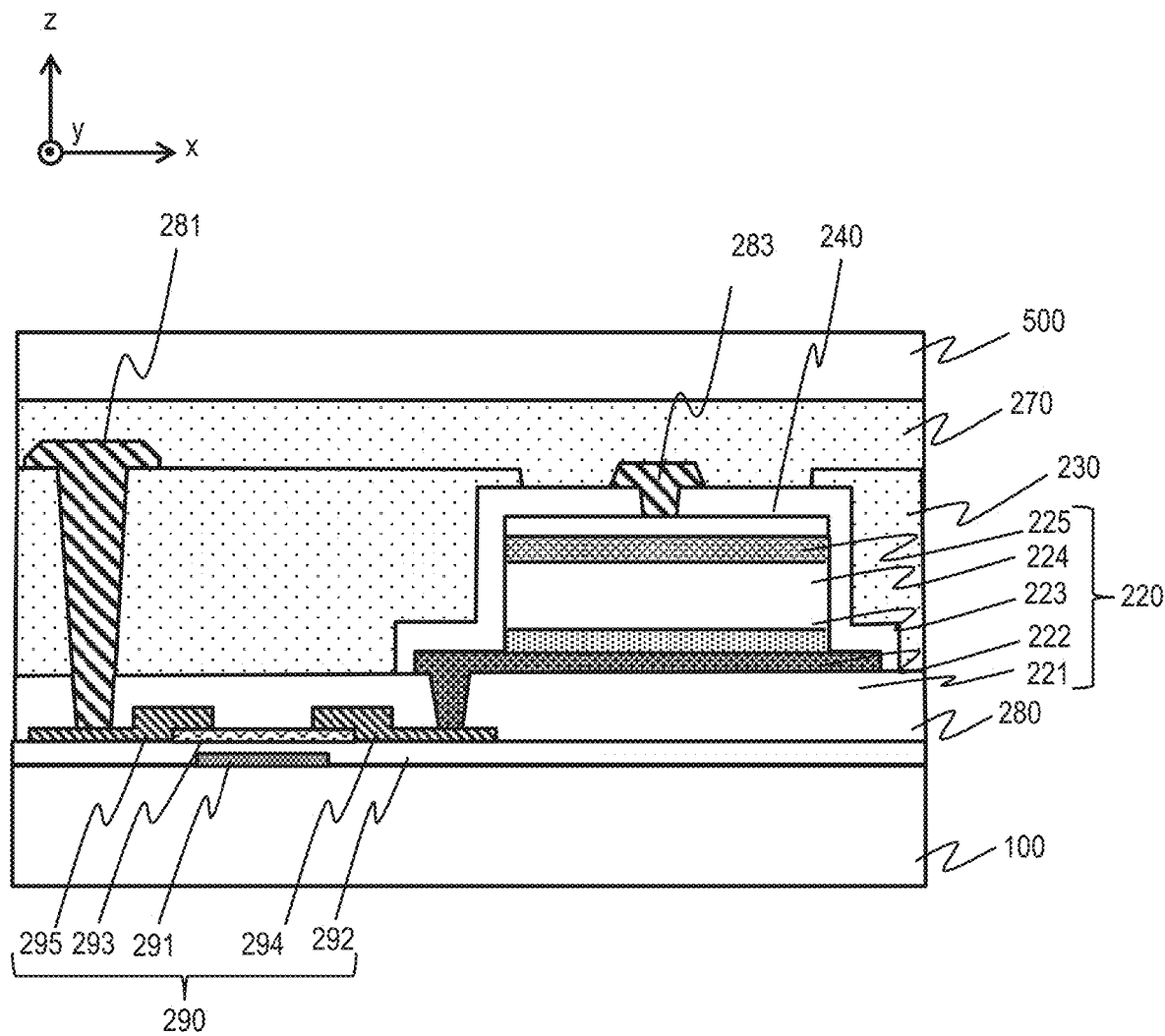
FIG. 15 is a cross-sectional view illustrating the eighth example of a cross-section of the photodiode array, taken along the line A-A' of FIG. 6.

FIG. 15 is a cross-sectional view illustrating the eighth example of the cross-section of the photodiode array 200, taken along the line A-A' of FIG. 6. The cross-sectional view of FIG. 15 is the same as FIG. 8 except that the photodiode array 200 does not include the second protective film 250 or third protective film 260.

The embodiments of the present disclosure have been described, but the present invention is not limited to those embodiments described above. For example, in the circuit configuration of the pixel 210 illustrated in FIG. 2, the anode terminal and the cathode terminal of the photodiode 220 may be connected to the TFT 290 and the bias line 283, respectively. Those skilled in the art can easily modify, add, or convert each element in the foregoing embodiment within the scope of this invention. A part of the configuration of one embodiment can be replaced with a configuration of another embodiment or a configuration of an embodiment can be incorporated into a configuration of another embodiment.

What is claimed is:
1. An image sensor, comprising:
a switching element disposed on a substrate;
a photoelectric conversion element connected to the switching element;
a first protective film directly covering the photoelectric conversion element; and
a first organic film formed at a layer above the switching element, the first organic film being in contact with the first protective film,
wherein the first organic film covers a first end portion of the photoelectric conversion element, the first end portion being at least a part of an end portion of the photoelectric conversion element, wherein the first organic film has a first covering portion at an end of the first organic film, wherein the first covering portion covers the first end portion, wherein the first covering portion is inclined down towards the photoelectric conversion element, and wherein the first organic film covers only the first end portion of the photoelectric conversion element.

2. The image sensor according to claim 1, wherein the first covering portion has a refractive index that is higher than a refractive index of a medium that is formed directly over the first covering portion.

3. The image sensor according to claim 1, further comprising a second protective film that directly covers the first organic film, wherein the second protective film has a direct cover portion that directly covers the first covering portion, and wherein the direct cover portion is inclined down towards the photoelectric conversion element.

4. The image sensor according to claim 3, wherein the second protective film has a refractive index that is higher than a refractive index of a medium that is formed directly over the second protective film.

5. The image sensor according to claim 3, wherein the second protective film directly covers the first protective film, and wherein the first protective film and the second protective film each are an inorganic film.

6. The image sensor according to claim 3, further comprising a plurality of pixels arranged in a matrix, wherein the plurality of pixels each include the switching element and the photoelectric conversion element, wherein the first organic film is disposed between the photoelectric conversion elements and outside an outermost photoelectric conversion element, the outermost photoelectric conversion element being a photoelectric conversion element located at an outermost position in the plurality of pixels, wherein the first organic film has an end portion that is located outside the outermost photoelectric conversion element, and wherein the end portion of the first organic film is directly covered by the second protective film.

7. The image sensor according to claim 1, further comprising a third protective film that directly covers a wiring line formed at a layer above the first organic film.

8. The image sensor according to claim 1, further comprising a second organic film at a layer above the first organic film.

9. The image sensor according to claim 1, further comprising a plurality of the photoelectric conversion elements; and a plurality of the first protective films separated from each other, wherein the plurality of first protective films directly cover the plurality of photoelectric conversion elements, respectively.

10. The image sensor according to claim 1, further comprising a plurality of the photoelectric conversion elements, wherein the first protective film having a plurality of portions connected to each other directly covers the plurality of photoelectric conversion elements.

11. The image sensor according to claim 1, further comprising a plurality of pixels arranged in a matrix, wherein the plurality of pixels each include the switching element and the photoelectric conversion element, wherein the image sensor includes:

a gate line and a signal line connected to the switching element;

a scanning unit that selects a pixel row made of pixels arranged in a row direction and outputs an output signal to a pixel of the selected pixel row to turn on the switching element; and a detection unit that detects a signal from a photoelectric conversion element of the pixel of the selected pixel row through the switching element that is turned on and the signal line, wherein the signal line is separated from the photoelectric conversion element through the first organic film.

12. The image sensor according to claim 1, further comprising a switching element protective film that covers the switching element, wherein the photoelectric conversion element and the first organic film are disposed on the switching element protective film.

* * * * *